United States Patent
Kurita (10) Patent No.: US 9,655,290 B2
(45) Date of Patent: May 16, 2017

(54) ELECTROMAGNETIC SHIELDING STRUCTURE

(71) Applicant: KITAGAWA INDUSTRIES CO., LTD., Inazawa-shi, Aichi (JP)

(72) Inventor: Tomohisa Kurita, Inazawa (JP)

(73) Assignee: KITAGAWA INDUSTRIES CO., LTD., Inazawa-Shi, Aichi (JP)

( * ) Notice: Subject to any disclaimer, the term of this patent is extended or adjusted under 35 U.S.C. 154(b) by 0 days.

(21) Appl. No.: 14/898,217

(22) PCT Filed: Jul. 1, 2014

(86) PCT No.: PCT/JP2014/067544
§ 371 (c)(1),
(2) Date: Dec. 14, 2015

(87) PCT Pub. No.: WO2015/005179
PCT Pub. Date: Jan. 15, 2015

(65) Prior Publication Data
US 2016/0150685 A1 May 26, 2016

(30) Foreign Application Priority Data
Jul. 10, 2013 (JP) .................................. 2013-144691

(51) Int. Cl.
*H05K 9/00* (2006.01)

(52) U.S. Cl.
CPC ......... *H05K 9/0026* (2013.01); *H05K 9/0028* (2013.01)

(58) Field of Classification Search
CPC .. H05K 9/0024; H05K 9/0026; H05K 9/0028; H05K 9/0016
(Continued)

(56) References Cited

U.S. PATENT DOCUMENTS 6,051,781 A * 4/2000 Bianca ................. H05K 9/0035
174/250
6,063,999 A * 5/2000 Kelly ................... H05K 9/0028
174/351
(Continued)

FOREIGN PATENT DOCUMENTS

JP 11-26978 1/1999
JP 2003-051692 2/2003
(Continued)

OTHER PUBLICATIONS

Akira, 1999, English translation of JP H11-26978.*
(Continued)

*Primary Examiner* — Steven T Sawyer
(74) *Attorney, Agent, or Firm* — Grossman, Tucker, Perreault & Pfleger, PLLC (57) ABSTRACT

An electromagnetic shielding structure in one aspect of the present invention comprises one and more gripping members and a shielding case. The shielding case has a roof section and a plurality of side walls. The roof section comprises a polygonal panel that is shaped so as not to fit inside a 30 mm×30 mm square region. The side walls comprise panels that are provided so as to hang from portions corresponding to part or entirety of some of sides of the polygonal roof, and each side wall is configured to contact the gripping member at a position within a predetermined distance from an edge of that side wall in a direction perpendicular to both a thickness direction of that side wall and a thickness direction of a printed circuit board.

20 Claims, 6 Drawing Sheets

(58) Field of Classification Search
USPC .......................................................... 174/351
See application file for complete search history.

(56) References Cited

U.S. PATENT DOCUMENTS 6,324,076 B1* 11/2001 Gerrits ................. H05K 5/0269
361/737
2011/0188226 A1* 8/2011 Kim ......................... H05K 9/00
361/818

FOREIGN PATENT DOCUMENTS

| JP | 2003-110274 | 4/2003 |
| JP | 2005-332953 | 12/2005 |
| JP | 2010-225770 | 10/2010 |

OTHER PUBLICATIONS

International Search Report from corresponding PCT Appln. No. PCT/JP2014/067544 dated Sep. 9, 2014. English translation attached.
Form PCT/IPEA/409 from corresponding PCT Appln. No. PCT/JP2014/067544 dated Jul. 3, 2015.
Form PCT/ISA/237 from corresponding PCT Appln. No. PCT/JP2014/067544 dated Sep. 9, 2014. Partial English translation attached.
English translation of International Preliminary Report on Patentability from corresponding PCT Appln. No. PCT/JP2014/067544 dated Jan. 14, 2016.
Office Action from corresponding Japanese Appln. No. 2013-144691 dated Mar. 14, 2017. English translation attached.

* cited by examiner

ELECTROMAGNETIC SHIELDING STRUCTURE

CROSS-REFERENCE TO RELATED APPLICATIONS

This international application claims the benefit of Japanese Patent Application No. 2013-144691 filed Jul. 10, 2013 in the Japan Patent Office, and the entire disclosure of Japanese Patent Application No. 2013-144691 is incorporated herein by reference.

TECHNICAL FIELD

The present invention relates to an electromagnetic shielding structure comprising one or more gripping members that are surface-mounted on a mounting surface of an electronic component of a printed circuit board, and a shielding case that is held with the gripping member and thereby attached to the printed circuit board.

BACKGROUND ART

For example, an electromagnetic shielding structure described in Patent Document 1 has been proposed. A gripping member disclosed in this Patent Document 1 has a portion used as a suction surface that can be suctioned by a suction nozzle of an automatic mounting machine, and is configured mountable on a printed circuit board by the automatic mounting machine.

Patent Document 1 also includes a description about a shielding case. However, the shielding case disclosed in Patent Document 1 is not the one to be attached to the printed circuit board by the automatic mounting machine.

PRIOR ART DOCUMENTS

Patent Documents

Patent Document 1: Japanese Unexamined Patent Application Publication No. H11-26978

SUMMARY OF THE INVENTION

Problems to be Solved by the Invention

Under the background as above, inventors of the present case have studied an attachment process of a shielding case, in order to achieve attachment of a shielding case by an automatic mounting machine or the like. However, the shielding case is a large component as compared to the aforementioned gripping member, etc. Therefore, it is not always easy to suction the shielding case by a suction nozzle of an automatic mounting machine and attach the same to the printed circuit board. Moreover, it is not always easy to properly hold the shielding case with the gripping member.

In particular, in a case of a shielding case as large as to exceed a 30 mm×30 mm square dimension when viewed from a direction perpendicular to a printed circuit board, it becomes much more difficult to properly hold the shielding case with a gripping member, as compared with a shielding case small enough to fit into the square dimension.

Thus, the inventors of the present case have further studied a technique to properly hold a larger shielding case with a gripping member. As a result, the inventors have found that, even in a case of a relatively large shielding case, it is possible to properly hold the shielding case with a gripping member, using an automatic mounting machine or the like, if a positional relation between the shielding case and the gripping member is properly adjusted.

In one aspect of the invention, it is desirable to allow attachment of a shielding case by an automatic mounting machine or the like, in an electromagnetic shielding structure configured to hold the shielding case with a gripping member to be surface-mounted on a printed circuit board.

Means for Solving the Problems

Hereinafter, a configuration employed in the present invention will be described.

An electromagnetic shielding structure in one aspect of the present invention comprises one and more gripping members, and a shielding case. The one or more gripping members are surface-mounted on a mounting surface of an electronic component of a printed circuit board. The shielding case is held with the gripping member and thereby attached to the printed circuit board. The shielding case has a roof section and a plurality of side walls. The roof section is configured to face the printed circuit board at a position to form a gap with the printed circuit board when the shielding case is attached to the printed circuit board. Each of the plurality of side walls is configured to be held with the gripping member in a state hanging toward the printed circuit board from each of a plurality of positions on a periphery of the roof section when the shielding case is attached to the printed circuit board. The roof section comprises a polygonal panel that is shaped so as not to fit inside a 30 mm×30 mm square region. The side walls comprise panels that are provided so as to hang from portions corresponding to part or entirety of some of sides of the polygonal roof, and each side wall is configured so as to contact the gripping member at a position within a predetermined distance from an edge of that side wall in a direction perpendicular to both a thickness direction of that side wall and a thickness direction of the printed circuit board (direction of the side wall along a direction to surround the gap, also referred to as a length direction of the side wall hereinafter). When the shielding case is attached to the printed circuit board, the electronic component mounted on the mounting surface is accommodated in a space surrounded by the printed circuit board, the roof section, and the side walls, and that a conductor provided on the printed circuit board and the shielding case are electrically coupled via the gripping member.

In the electromagnetic shielding structure, the shielding case comprises a polygonal panel with the roof section that is shaped so as not to fit inside the 30 mm×30 mm square region. The polygon referred to herein, for example, is a quadrangle such as a rectangle or square, or a substantially L-shaped hexagon or shape surrounded by a larger number of sides. In a case of a rectangle or square, each interior angle formed by two adjacent sides is less than 180 degrees. In a case of a substantially L-shaped polygon, one or more of all interior angles formed by two adjacent sides exceed 180 degrees. Any of these shapes may be chosen. In addition, these shapes need not be regular polygons, and may be regular polygons.

Such a shielding case, as compared with a small shielding case of which roof section fits inside the 30 mm×30 mm square region, is a correspondingly large shielding case. Therefore, in a case of such a large shielding case, even if the shielding case is disposed at a predetermined position by an automatic mounting machine and pushed toward the gripping member, mere appropriate arrangement of a plurality of gripping members may not permit the shielding case to be properly held with the gripping members.

In contrast, in the electromagnetic shielding structure described above, each side wall and the gripping member are configured to contact each other at a position within a predetermined distance from an edge of the side wall in the direction perpendicular to both the thickness direction of the side wall of the shielding case and the thickness direction of the printed circuit board (length direction of the side wall). Therefore, in such an electromagnetic shielding structure, when the shielding case is disposed at a position described above by an automatic mounting machine and the shielding case is pushed toward the gripping member, the shielding case is properly held with the gripping member.

The inventors of the present case conducted a series of experiments and found that the shielding case is properly held with the gripping member, if there is a contact between the side wall and the gripping member at a position within a predetermined distance from the edge of the side wall. The reason why such an effect is obtained itself is not clearly elucidated at present.

In guessing the factors that can be considered, even if there is a contact between the side wall and the gripping member at a position closer to or farther from the edge of the side wall than the position described above, if there is no contact between the side wall and the gripping member at s position within a predetermined distance from the edge of the side wall, part of the shielding case may not be deformed than expected for example, upon pushing the shielding case toward the gripping member. In that case, an excessive force may act on the gripping member from the shielding case while the shielding case is unable to reach the mounting position of the gripping member. As a result, there is a possibility that the deformation of the gripping member occurs. Another possibility is that part of the shielding case may also be deformed than expected. In that case, a force in an unexpected direction may act on the gripping member from the shielding case. As a result, there is a possibility that the deformation of the gripping member occur. If distortion and twisting as such occur to the shielding case or the gripping member, it is possible that there may be a decrease in insertability to the gripping member. Or, there may be further other possibilities. It will become clear from experimental results in an embodiment to be described later that adjusting the position of contact between the side wall and the gripping member within a predetermined distance achieves a desired effect.

Therefore, if the configuration described above is employed, and a preferred distance is confirmed and optimized in advance as the position of contact between the side wall and the gripping member, it is possible to properly hold the shielding case with the gripping member by disposing the shielding case at a predetermined position, using an automatic mounting machine, and by pushing the shielding case toward the gripping member.

Note that, in the electromagnetic shielding structure described above, a preferred distance as the position of contact between the side wall and the gripping member needs only be optimized by a technique of such as experimental confirmation. In one example of the distance confirmed by the inventors of the present case, for example, the side wall may be configured to contact the gripping member at a position spaced by 2 to 5 mm from the edge of the side wall in the direction perpendicular to both the thickness direction of the side wall and the thickness direction of the printed circuit board (length direction of the side wall). With such an electromagnetic shielding structure it is possible to properly hold the shielding case with the gripping member by disposing the shielding case at a predetermined position, using an automatic mounting machine, and by pushing the shielding case toward the gripping member.

Also in the electromagnetic shielding structure described above, if the single side wall is held with a plurality of gripping members, each of the adjacent gripping members and the side wall may be configured to contact at a position spaced by 2 to 5 mm from each other. If such a position is a position of contact between the side wall and the gripping member, the shielding case is properly held with the gripping members upon pushing the shielding case toward the gripping member. This is also found by the inventors of the present case through a series of experiments. The reason why such an effect is obtained is not clearly elucidated at present as well. However, if an interval of the adjacent positions of contact becomes closer than the above described numerical range, a frictional resistance in the vicinity of the contacts increases. Thus, it is presumed that insertability of the shielding case decreases. Further, if an interval between the adjacent positions of contact becomes farther than the above described numerical range, the position of the side wall is not restricted over a long distance. Therefore, even if the side wall is deformed within a tolerance, an amount of deformation becomes correspondingly large. Thus, it is presumed that distortion and twisting of the shielding case easily occur, which may adversely affect the insertability of the shielding case.

In addition, in the electromagnetic shielding structure described above, the gripping member may be formed to have a dimension of 2 to 10 mm in the direction perpendicular to both the thickness direction of the side wall and the thickness direction of the printed circuit board (length direction of the gripping member). The gripping member having such a dimension can be disposed in a narrower space, as compared with a gripping member having a dimension over 10 mm. Moreover, as compared with a gripping member having a dimension less than 2 mm, it is not necessary to excessively downsize a grip portion provided on the gripping member. Therefore, it is possible to properly hold the shielding case with the gripping member, without excessively weakening a gripping force by the grip portion.

Furthermore, in the electromagnetic shielding structure described above, each of the one or more gripping members may comprise one or more grip portions. The grip portion may comprise one or more inner surface side grip portions to be pressed against an inner surface of the side wall and one or more outer surface side grip portions to be pressed against an outer surface of the side wall. The inner surface side grip portion and the outer surface side grip portion provided in the one or more gripping members may cooperate to hold the shielding case. In this case, the inner surface side grip portion and the outer surface side grip portion may be formed to have a dimension of 1 to 2 mm in the direction perpendicular to both the thickness direction of the side wall and the thickness direction of the printed circuit board. With the grip portion having such a dimension, as compared with a case of the grip portion having a dimension over 2 mm, the gripping force by the grip portion is not to be excessively strong. Therefore, it is possible to impart a spring property appropriate for easy insertion of the shielding case. Moreover, as compared with a case of the grip portion having a dimension less than 1 mm, the gripping force by the grip portion is not to be excessively weakened. Therefore, it is possible to properly hold the shielding case with the gripping member.

In addition, in the electromagnetic shielding structure described above, the gripping member may have a suction surface that can be suctioned by a suction nozzle of an automatic mounting machine, and the suction surface may be formed to have a dimension of 0.5 to 2 mm in the direction perpendicular to both the thickness direction of the side wall and the thickness direction of the printed circuit board. With the suction surface of such a dimension, it is possible to suction the gripping member by the suction nozzle of the automatic mounting machine, and properly place the gripping member at a predetermined position on the printed circuit board. Therefore, it is possible to properly hold the shielding case with the gripping member.

BRIEF DESCRIPTION OF THE DRAWINGS

FIGS. 3A-3D show the conductive gripping member, in which

EXPLANATION OF REFERENCE NUMERALS

1 . . . electromagnetic shielding structure, 3 . . . gripping member, 5 . . . shielding case, 5A . . . roof section, 5B . . . side wall, 5C . . . hole, 7 . . . printed circuit board, 9A-9C . . . electronic component, 13 . . . base, 13A, 13B . . . solder joint, 13C . . . float section, 15, 16 . . . grip portion, 21 . . . first spring portion, 22 . . . second spring portion, 23 . . . third spring portion, 24 . . . fourth spring portion, 25 . . . convex portion.

Mode For Carrying Out The Invention

Hereinafter, an exemplary embodiment of the present invention will be described. In the following, a description will be given using each of up, down, right, left, front and rear directions shown in the figure as required. Each of these directions is only defined to briefly describe relative positional relations of components that make up the electromagnetic shielding structure. Thus, for example, it is optional which direction the electromagnetic shielding structure is oriented in an actual device.

[Specific Example of the Electromagnetic Shielding Structure]

Figure 1:
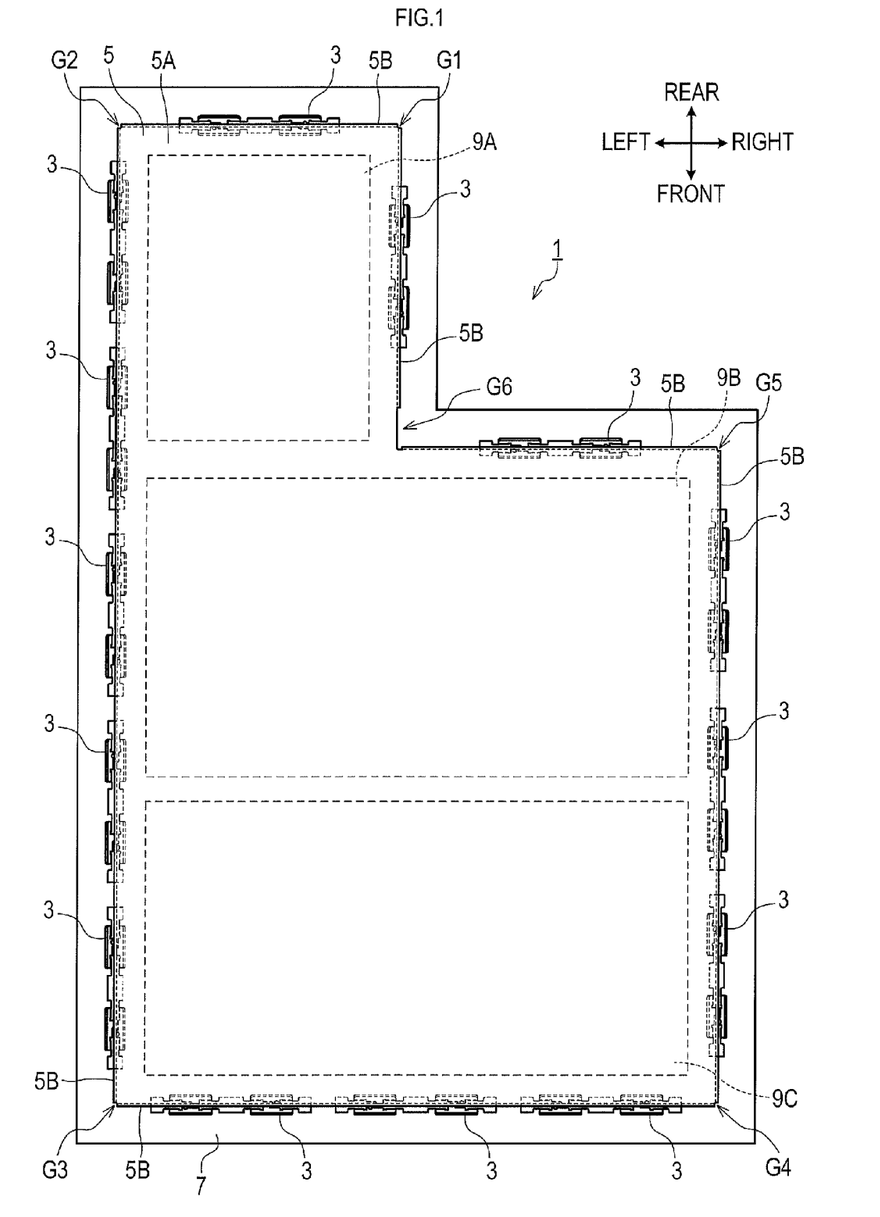
FIG. 1 is a plan view of an electromagnetic shielding structure of an embodiment.

As shown in FIG. 1, an electromagnetic shielding structure 1 comprises a plurality of (fourteen in this embodiment) gripping members 3 and a shielding case 5. The gripping members 3 are metal components surface-mounted at positions to surround electronic components 9A, 9B and 9C on a component mounting surface of a printed circuit board 7. Each of the gripping members 3 is electrically coupled to a conductor portion having a ground potential on the component mounting surface of the printed circuit board 7. The shielding case 5 is held with the gripping member 3 and thereby attached to the printed circuit board 7.

The shielding case 5 comprises a roof section 5A, and a plurality of side walls 5B. The roof section 5A comprises a polygonal (hexagonal in this embodiment) panel that is shaped so as not to fit inside a 30 mm×30 mm square region in a plan view. The plurality of side walls 5B are provided in a manner hanging from positions corresponding to sides on a periphery of the roof section 5A. Each of the plurality of side walls 5B comprises a generally rectangular panel. A length of the panel in a plan view is substantially the same as or slightly shorter than a length of each side of the polygonal roof. A dimension in a height direction of the panel is the same in each of the side walls 5B.

The roof section 5A and side walls 5B are formed by pressing a metal (stainless steel in this embodiment) thin plate (having a thickness of 0.1 mm in this embodiment). More specifically, a metal plate is punched into a predetermined shape, and boundaries between a portion corresponding to the roof section 5A and portions corresponding to the side walls 5B included in the plate material of the predetermined shape are bent at right angles. Thereby, a desired shape is formed. For the convenience, gaps G1 to G6 are formed between the adjacent side walls 5B, 5B.

The gaps G1 to G5 correspond to positions where an interior angle of the hexagon of the roof section 5A is within 90 degrees (90 degrees in the present embodiment). In this case, a width of each of the gaps G1 to G5 is very small. On the other hand, the gap G6 corresponds to a position where the interior angle of the hexagon of the roof section 5A is over 90 degrees (270 degrees in the present embodiment). In this case, a width of the gap G6 is wider than that of each of the gaps G1 to G6.

When the shielding case 5 is attached to the printed circuit board 7, the roof section 5A faces the printed circuit board 7 at a position to form a space with the printed circuit board 7. The plurality of side walls 5B are in a state where each hanging toward the printed circuit board 7 from a position corresponding to each side on the periphery of the roof section 5A. Therefore, leading ends in a hanging direction of the side walls 5B are held with the gripping members 3.

The electronic components 9A to 9C surface-mounted on the component mounting surface of the printed circuit board 7 are accommodated in a space surrounded by the printed circuit board 7, the roof section 5A, and the side walls 5B. The conductor portion provided on the printed circuit board 7 and the shielding case 5 are electrically coupled via the gripping members 3. Thereby, the shielding case 5 shields electromagnetic waves radiated outside of equipment from the electronic components 9A to 9C mounted on the printed circuit board 7. The shielding case 5 also shields electromagnetic waves that enter the electronic components 9A to 9C from outside the equipment.

[Details of the Gripping Member]

The gripping member 3 is formed by pressing (stamping and bending, etc.) a metal (phosphor bronze for springs in this embodiment) thin plate (having a thickness of 0.1 mm in this embodiment). Also in this embodiment, Cu plating and Sn plating are applied to the surface of the grip member 3.

Figure 2:
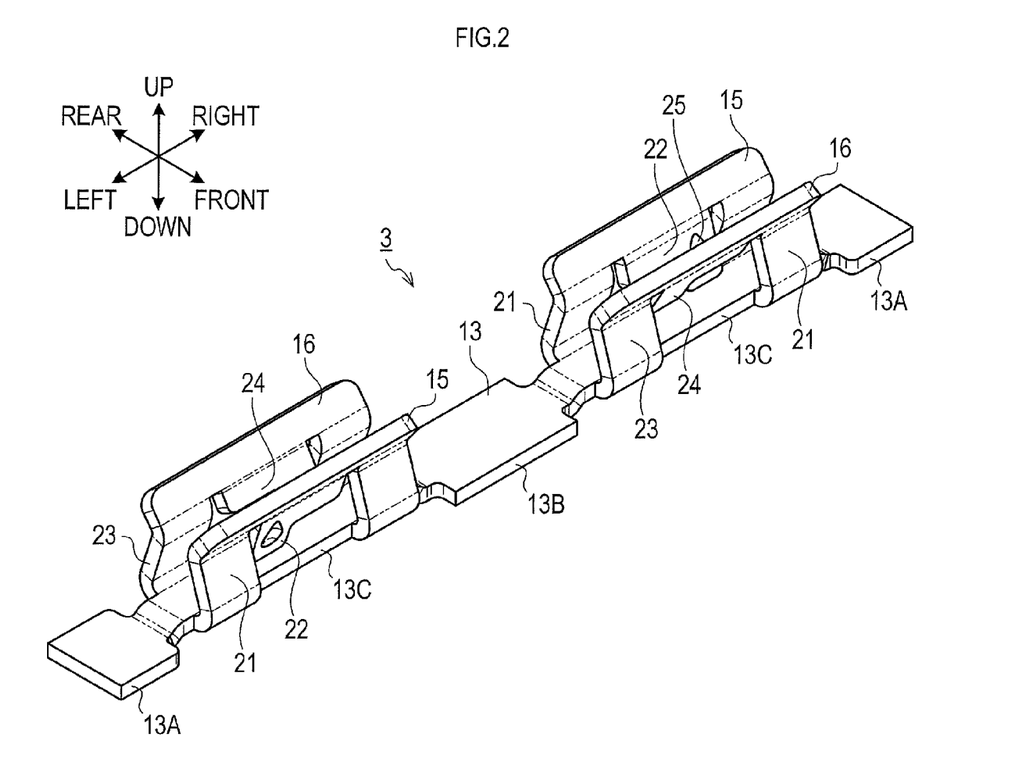
FIG. 2 is a perspective view showing a conductive gripping member.
Figure 3A:
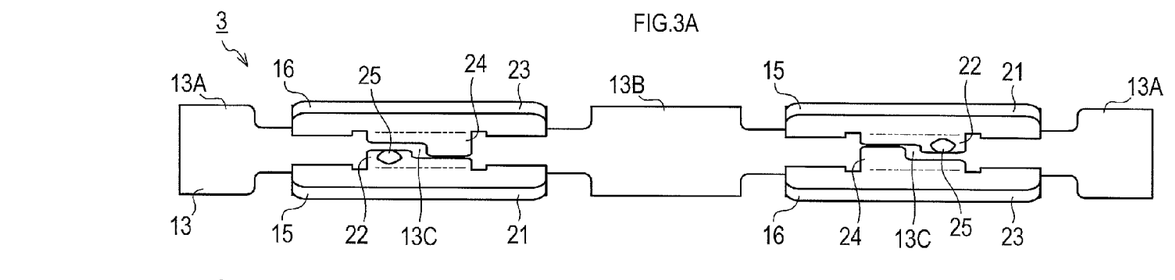
FIG. 3A is a plan view.

The gripping member 3, as illustrated in FIG. 2, comprises a base 13, and two pairs of grip portions 15, 16, 15, 16. The grip portions 15 and 16 make a pair. The base 13 and the grip portions 15, 16, 15, 16, as shown in FIGS. 3A and 3C, have a rotationally symmetrical shape, which shape is the same even if it makes a half turn (180° rotation) around a symmetric axis, which axis being an imaginary axis extending in an up and down direction in FIG. 2. In this embodiment, the gripping member 3 shown in FIG. 2 has a dimension of 6.5 mm in a right and left direction, a dimension of 0.8 mm in the up and down direction, and a dimension of 0.6 mm in a front and rear direction. In addition, a rear view of this gripping member 3 appears identical to a front view shown in FIG. 3B, and a left side view appears identical to a right side view shown in FIG. 3D.

The base 13 is soldered to the printed circuit board 7 to be electrically coupled to the conductor portion of the printed circuit board 7. The base 13 comprises solder joints 13A, 13A, 13B and float sections 13C, 13C. Undersurfaces of the solder joints 13A, 13A, 13B are interfaces with the printed circuit board 7. A top surface of the solder joint 13B is a suction surface that can be suctioned by a suction nozzle of an automatic mounting machine (not shown). The float sections 13C, 13C form a space with the printed circuit board 7 when the solder joints 13A, 13A, 13B are soldered to the printed circuit board 7. In this embodiment, undersurfaces of the float sections 13C, 13C are positioned 0.05 mm above the undersurfaces of the solder joints 13A, 13A, 13B.

Of the grip portions 15, 16 to be paired, the grip portion 15 has a first spring portion 21 and a second spring portion 22. The first spring portion 21 is formed into a shape extending upward to a leading end from the base 13 as a base end. The second spring portion 22 is formed into a shape extending obliquely downward to a leading end from an upper portion of the first spring portion 21 as a base end. The second spring portion 22 is formed by cutting and raising part of the first spring portion 21 into a tongue shape.

The other grip portion 16 has a third spring portion 23 and a fourth spring portion 24. The third spring portion 23 is formed into a shape extending upward from the base 13 as a base end. The fourth spring portion 24 is formed into a shape extending obliquely downward to a leading end from an upper portion of the third spring portion 23 as a base end. The fourth spring portion 24 is formed by cutting and raising part of the third spring portion 23 into a tongue shape.

The second spring portion 22 extends in a direction to come closer to the other grip portion 16 toward the leading end. The fourth spring 24 extends in a direction to come closer to the grip portion 15 toward the leading end. A spring length from the base end to the leading end of the second spring portion 22 is greater than a spring length from the base end to the leading end of the fourth spring portion 24. The second spring portion 22 of the grip portion 15 has a convex portion 25 that projects toward the grip portion 16.

In a width direction orthogonal to both the extending direction and a thickness direction (right and left direction in FIG. 2), the second spring portion 22 and the fourth spring portion 24 have a portion having a wider widthwise dimension than that of the leading end at the base end, and have a portion having a narrower widthwise dimension than that of the base end at the leading end. Of these portions, the portions having a wider widthwise dimension are provided at positions to face each other across an arrangement position of the side wall 5B, and the portions having a narrower widthwise dimension are provided at positions not to overlap with each other in a state viewed from a direction perpendicular to the side wall 5B (see FIG. 3B).

[Assembly Process of the Electromagnetic Shielding Structure]

The electromagnetic shielding structure 1 described as above will be assembled in the following procedure.

The gripping members 3 are surface-mounted together with the electronic components 9A to 9C at predetermined positions according to the shape and dimensions of the shielding case 5. At that time, the gripping members 3 are disposed on the printed circuit board 7 by an automatic mounting machine (not shown).

After the surface-mounting of the gripping members 3, the shielding case 5 is attached. The shielding case 5 is also placed on the printed circuit board 7 by the automatic mounting machine (not shown). At that time, bottom ends of the side walls 5B of the shielding case 5 are pushed against the gripping members 3. If the shielding case 5 has a certain dimension (specifically, if having a dimension that exceeds a 30 mm×30 mm square dimension when viewed from a direction perpendicular to the printed circuit board 7), the shielding case 5 is once provisionally arranged on the printed circuit board 7. Subsequently, a plurality of positions of the shielding case 5 are pushed in order toward the printed circuit board 7. As a result, the shielding case 5 is properly attached to the printed circuit board 7. The positions to be pushed of the shielding case 5 are selected in consideration of the shape, etc. of the shielding case 5, and are pushed in an order, for example, starting from corners in a plan view, corners diagonal to the corners in a plan view, sides between the corners if necessary, and so on.

Figure 3B:
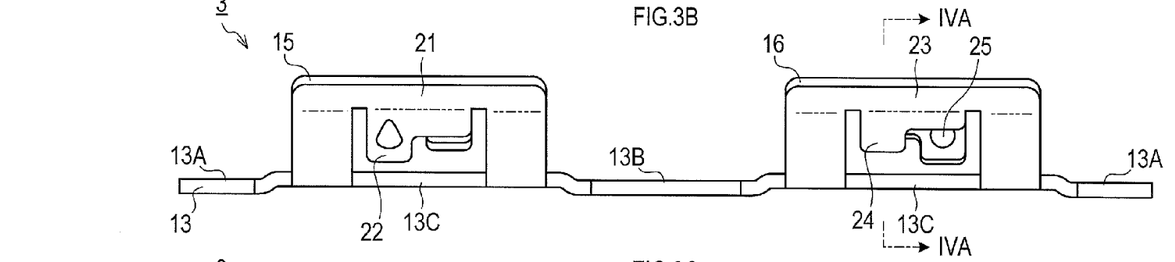
FIG. 3B is a front view.
Figure 3C:
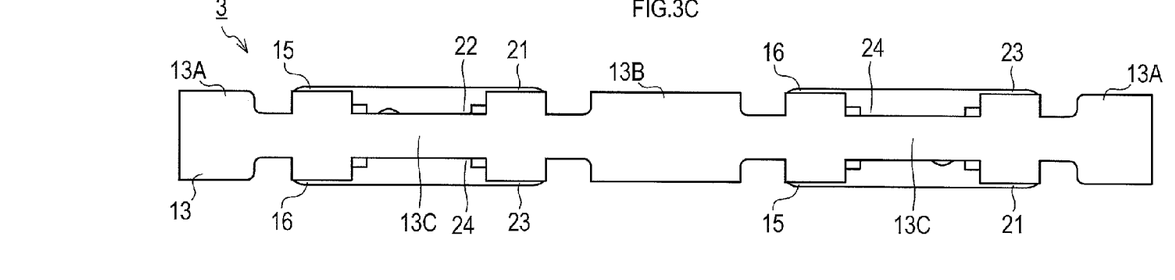
FIG. 3C is a bottom view.
Figure 3D:
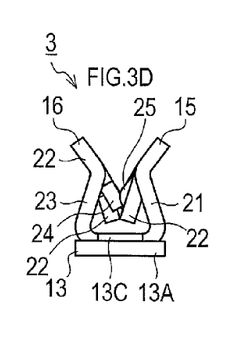
FIG. 3D is a right side view.
Figure 4A:
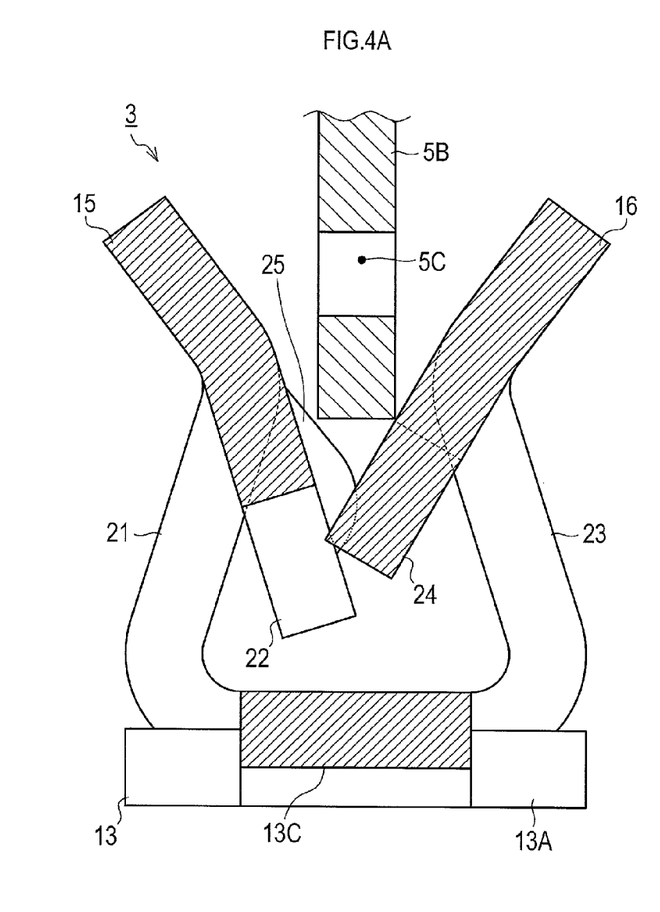
FIGS. 4A-4B are explanatory views showing a state of elastic deformation of a shielding case gripping member of the embodiment.
Figure 4B:
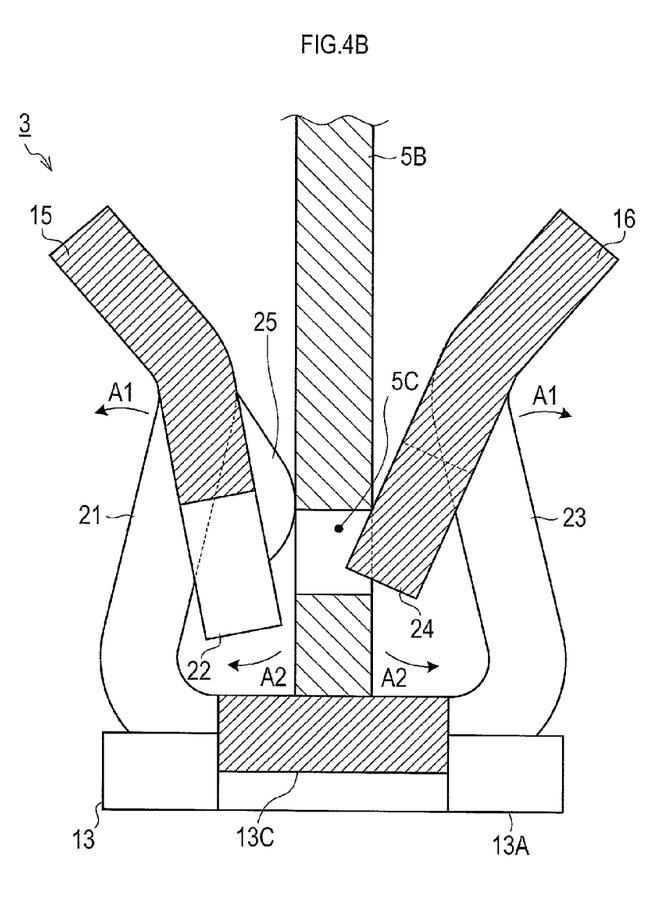

FIGS. 4A and 4B are sectional views taken along a cut plane indicated by IVA-IVA line in FIG. 3B. When the bottom ends of the side walls 5B are pushed against the gripping members 3, the side walls 5B are moved to positions shown in FIG. 4B from positions shown in FIG. 4A. Then, the side walls 5B cut in between the grip portions 15 and 16. At this time, the grip portions 15 and 16, accompanied by elastic deformation, are displaced to the positions shown in FIG. 4B from the positions shown in FIG. 4A.

More specifically, in the grip portions 15 and 16, the first spring portion 21 and the third spring portion 23 are elastically deformed in directions to expand a distance between upper ends of the spring portions 21 and 23 (directions indicated by arrows A1, A1 in FIG. 4B). Meanwhile, the second spring portion 22 and the fourth spring portion 24 are elastically deformed in directions to expand a distance between the lower ends (directions indicated by arrows A2, A2 in FIG. 4B).

In the case exemplified in FIGS. 4A and 4B, a hole 5C is formed in the shielding case 5. Whether to provide such a hole 5C to the shielding case 5 is optional. In the following description, a case with the hole 5C and a case without the hole 5C will be described in turn.

First, in the case where the shielding case 5 is provided with the hole 5C, as the shielding case 5 is pushed into a position to abut on the base 13 (float section 13C), a leading end of the fourth spring portion 24 is fitted into the hole 5C. Thus, the fourth spring portion 24 functions as a retaining piece for inhibiting the shielding case 5 from escaping from between the grip portions 15 and 16.

In particular, in this embodiment, the leading end of the fourth spring portion 24 reaches a position closer to the first spring portion 21 than an intermediate position between the first spring portion 21 and the third spring portion 23 in a state viewed from a direction parallel to both the side wall 5B and the printed circuit board 7. Therefore, the leading end of the fourth spring portion 24 penetrates sufficiently deep into the hole 5C, and exerts a favorable retaining effect.

In this gripping state (state shown by a solid line in FIG. 4B), a bottom end of the side wall 5B is in contact with the base 13. Therefore, even if a force to temporarily displace the side wall 5B downward acts, the side wall 5B is not easily displaced downward. In addition, the first spring portion 21 and the third spring portion 23 also inhibit the side wall 5B from being displaced downward. That is, the first spring portion 21 and the third spring portion 23 are inclined in the directions to narrow the distance therebetween toward the upper ends. Therefore, when the force to displace the side wall 5B downward is applied, some of the force acts in directions to narrow the distance between the upper ends of the first spring portion 21 and the third spring portion 23. Therefore, a pressing force (gripping force) against the side wall 5B should increase. Thus, the effect to inhibit the side wall 5B from being displaced downward increases.

Furthermore, in such a gripping state (state shown by the solid line in FIG. 4B), the second spring portion 22 and the fourth spring portion 24 inhibit the side wall 5B from being displaced upward. That is, the second spring portion 22 and the fourth spring portion 24 are inclined in directions to narrow the distance therebetween toward the lower ends. Therefore, when a force to displace the side wall 5B upward is applied, some of the force acts in directions to narrow the distance between the lower ends of the second spring portion 22 and the fourth spring portion 24. Therefore, a pressing force (gripping force) against the side wall 5B should increase. Thus, the effect to inhibit the side wall 5B from being displaced upward increases.

The gripping members 3 are soldered to conductor portions so as to have a ground potential on the printed circuit board 7. Accordingly, the shielding case 5 is electrically coupled to the conductor portion, and thus the shielding case 5 also becomes a portion having the ground potential.

Figure 5A:
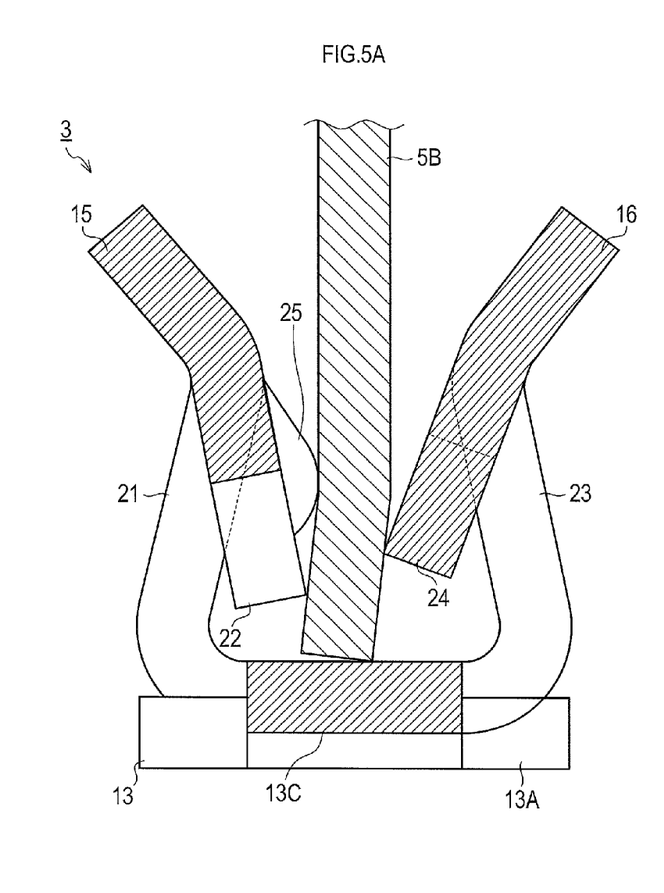
FIGS. 5A-5B are explanatory views showing a deformed state of the shielding case of the embodiment.
Figure 5B:
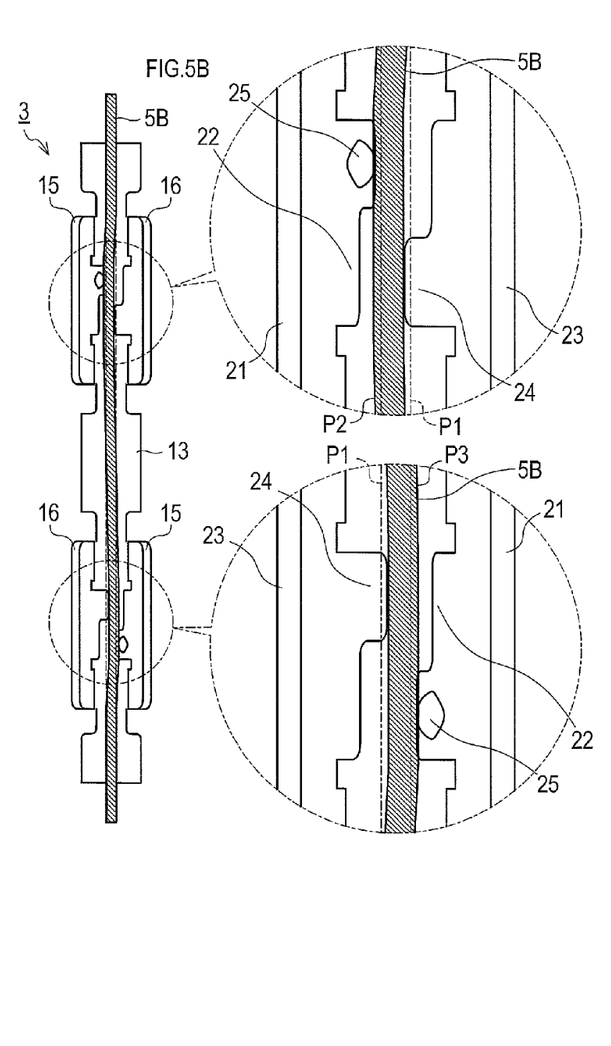

On the other hand, if the hole 5C is not provided to the shielding case 5, the side wall 5B of the shielding case 5 is inserted between the second spring portion 22 of the fourth spring portion 24, a convex portion 25 of the second spring portion 22 and the leading end of the fourth spring portion 24 are pressed against the side wall 5B, as shown in FIGS. 5A and 5B. The side wall 5B is pushed toward the other grip portion 16 at a height position near the convex portion 25, and is pushed toward the one grip portion 15 at a height position near the leading end of the fourth spring portion 24.

In this case, unlike the case where the side wall 5B is held from both sides at the same height, the side wall 5B, for example, as illustrated in FIG. 5A, is partially bent. As a result, a distortion undulating in an up and down direction is generated in the side wall 5B. If such a distortion is produced in the side wall 5B, the side wall 5B is less likely to escape from the grip member 3 as compared to a case of gripping a flat part without a similar distortion.

In the example illustrated in FIG. 5A, the fourth spring portion 24 is closer to the bottom end of the side wall 5B than the convex portion 25. Therefore, the bottom end of the side wall 5B is pushed toward the one grip portion 15 with deformation. In FIG. 5A, the bottom end of the side wall 5B is shifted to the left side.

However, the gripping member 3 is provided with the two pairs of grip portions 15, 16, 15, 16. As already described, the two pairs of grip portions 15, 16, 15, 16 are horizontally rotationally symmetrical so that these grip portions have the same shape even if a half rotation (180° rotation) is made. Therefore, the bottom end of the side wall 5B is deformed, as shown in FIG. 5B. In FIG. 5B, the side wall 5B without distortion is shown in a broken line P1, and the side wall 5B with distortion is shown by solid lines P2, P3. As shown in an upper enlarged view of FIG. 5B, the side wall 5B is distorted to the left in one of the pairs of grip portions 15 and 16. As shown in a lower enlarged view of FIG. 5B, the side wall 5B is distorted to the right in the other of the pairs of grip portions 15 and 16. Therefore, in the side wall 5B, in addition to the distortion undulating in the up and down direction, a distortion undulating in a horizontal direction is also produced, which is also a factor to make it difficult for the shielding case 5 to escape from the grip member 3.

Figure 6:
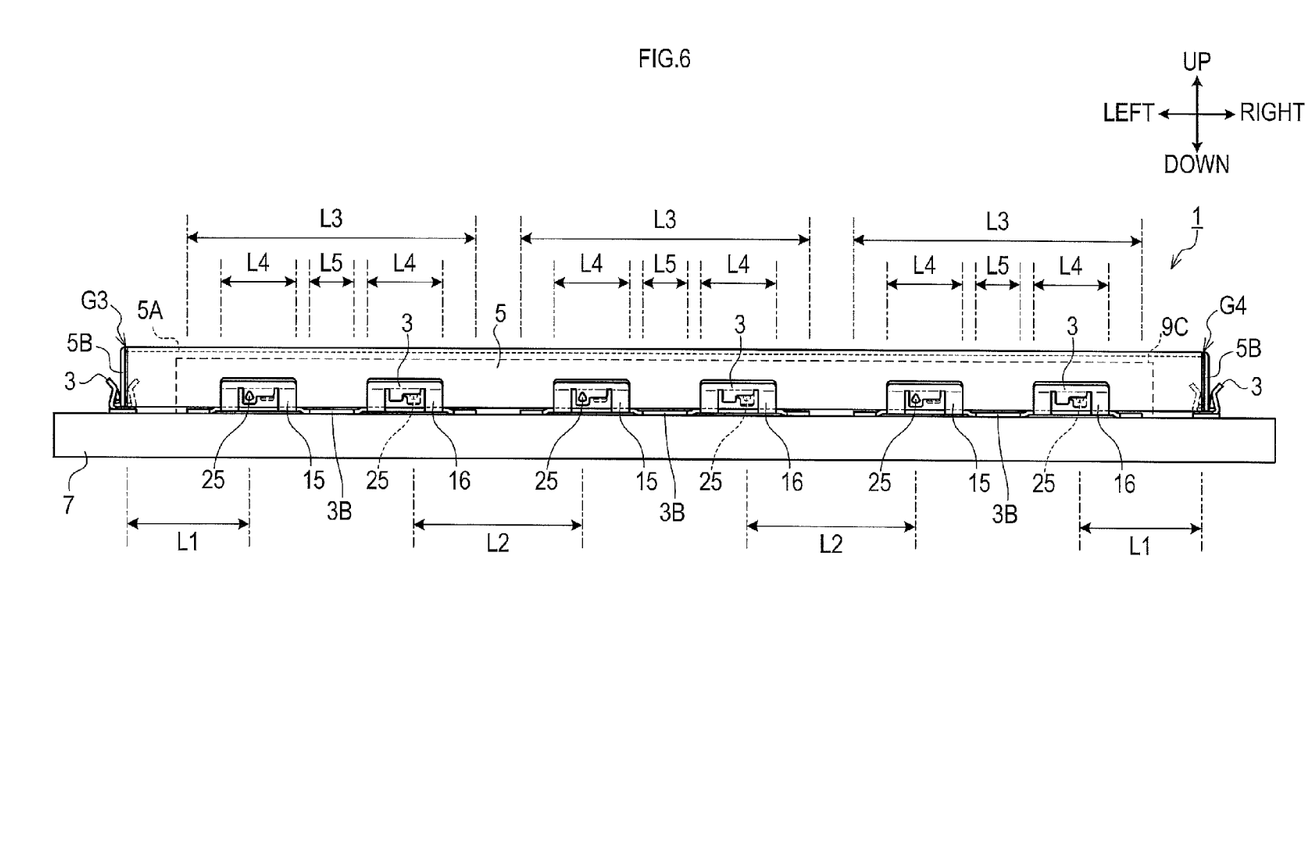
FIG. 6 is a front view of the electromagnetic shielding structure of the embodiment.

Now, in the electromagnetic shielding structure 1 as described above, each of the gripping members 3 is disposed at a position where a distance L1 from an end of the side wall 5B (end portion forming the gap G1 to G6) to a contact portion with the side wall 5B (convex portion 25) and a distance L2 between each of the adjacent gripping members 3, 3 and the contact portion with the side wall 5B (between the convex portions 25, 25), as shown in FIG. 6, are within a predetermined distance. Specifically, in the present embodiment, both the distances L1, L2 are in a range of 2 to 5 mm This is because it has turned out that, as a result of attempting to attach the shielding case 5 by an automatic mounting machine with changes of the distances L1, L2 within a range of 1 to 10 mm, favorable attachment is achieved if the distances L1, L2 are set in the range of 2 to 5 mm Specifically, with the distances L1, L2 in the range of 2 to 5 mm, mounting failure of the shielding case 5 did not occur even in 100 times trials. In contrast, with the distances L1, L2 shortened to 1 mm and with the distances L1, L2 expanded to 6 mm and up to 10 mm, mounting failure occurred in one to several times in 100 times trials.

Why mounting failure occurs is not always clear. With the too shortened distances L1, L2, bending of the side wall 5B at the time of attaching the shielding case 5 is excessively restricted, which may make it difficult to push the shielding case 5 into the gripping member 3. Alternatively, with the too expanded distances L1, L2, the side wall 5B at the time of attaching the shielding case 5 is easily bent excessively, which may make it difficult to push the shielding case 5 into the gripping member 3. Alternatively, with the too shortened distances L2, a frictional force acting on the shielding case 5 upon attaching the shielding case 5 may become excessive.

A specific condition of the mounting failure is deformation of the gripping member 3. More specifically, with the distances L1, L2 shortened to 1 mm, even if a load is applied to a direction perpendicular to the printed circuit board 7 (hereinafter, vertical direction) at a stage of implementing an initial push upon pushing the shielding case 5 at a plurality of positions, there is a tendency that a force in a direction parallel (lateral) to the printed circuit board 7 with respect to the gripping member 3 is easily added until completion of the push to a proper position. If such a load applied in the lateral direction is greater than expected, tolerance and attachment position accuracy of the shielding case 5 and tolerance of the gripping member 3 are not adequately absorbed completely. As a result, it is considered that deformation of the gripping member 3 occurs. Meanwhile, with the distances L1, L2 expanded to 6 mm and up to 10 mm, there is a tendency that influence of a slight positional deviation, if any, in the mounting position of each of the surface-mounted gripping members 3 increases. Therefore, again, it is considered that the load applied in the lateral direction may become greater than expected, and deformation of the gripping members 3 may occur.

Among these distances L1, L2, when the distance L1 is set in the range of 2 to 5 mm, mounting failure did not occur even if the distance L2 is set to 6 mm. However, when the distance L1 is set to 6 mm, mounting failure has occurred only once even if the distance L2 is set in the range of 2 to 5 mm. Therefore, it is preferable to set at least the distance L1 to be in the range of 2 to 5 mm. It is also preferable to set the distance L2 to be in the range of 2 to 5 mm as well.

If the shielding case 5 has the hole 5C as described above (see FIGS. 4A and 4B), mounting failure tends to be less likely to occur as compared with the case without the hole 5C (see FIG. 5A). When second and subsequent pushes are implemented upon pushing the shielding case 5 at a plurality of positions, a force is easily applied in a direction to lift the shielding case 5 at the position where the shielding case 5 is pushed earlier. However, if the hole 5C is provided, even if the force is applied in the direction to lift the shielding case 5, there is a possibility that the lifting of the shielding case 5 is inhibited by the hole 5C. In particular, such lifting is likely to occur at the initial pushing position. Therefore, it is also effective to provide the hole 5C only at a position corresponding to the initial pushing position. With such measures, it is possible to inhibit factors that may lead to failure such as the displacement or loosening, etc. of the shielding case 5.

Further, in this embodiment, the gripping member 3 is formed such that a dimension L3 perpendicular to both the thickness direction of the side wall 5B and the thickness direction of the printed circuit board 7 (length of the gripping member) is 2 to 10 mm. With such a dimension, as compared with a case of the dimension L3 over 10 mm, it is also possible to dispose the gripping member 3 in a narrower space. Moreover, as compared with a case of the dimension L3 less than 2 mm, it is not necessary to design excessively small grip portions 15 and 16. Therefore, a gripping force by the grip portions 15 and 16 is not to be excessively weakened. Thus, it is possible to properly hold the shielding case 5 with the gripping member 3.

In this embodiment, the grip portions 15 and 16 to be paired are formed such that a dimension L4 in the direction perpendicular to both the thickness direction of the side wall 5B and the thickness direction of the printed circuit board 7 (length of the grip portion) is 1 to 2 mm. With such a dimension, as compared with a case of the dimension L4 over 2 mm, the gripping force by the grip portions 15 and 16 is not to be excessively strong. It is possible to apply moderate elasticity that makes it easy to insert the shielding case 5 to the grip portions 15 and 16. Moreover, as compared with a case of the dimension L4 less than 1 mm, the gripping force by grip portions 15 and 16 is not to be excessively weakened. It is possible to properly hold the shielding case 5 with the gripping member 3.

Further, in the gripping member 3, the top surface of the solder joint 13B is a suction surface that can be suctioned by a suction nozzle of an automatic mounting machine. Also, the solder joint 13B is formed such that a dimension L5 perpendicular to both the thickness direction of the side wall 5B and the thickness direction of the printed circuit board 7 (length of the joint) is 0.5 to 2 mm. With such a dimension, it is possible to suction the gripping member 3 by the suction nozzle of the automatic mounting machine and properly dispose the gripping member 3 at a predetermined position on the printed circuit board 7. Therefore, it is possible to properly hold the shielding case 5 with the gripping member 3.

[Other Embodiments]

The exemplary embodiment of the present invention has been described above. However, the present invention is not limited to the exemplary embodiment described above, and can be embodied in various other forms.

For example, in the above embodiment, in the case shown in FIG. 1, each of the six sides of the shielding case 5 that looks like a hexagon in a plan view is held with one or more gripping members 3. However, whether to hold all the six sides with the gripping members 3 is optional. For example, the gripping member 3 may not be arranged for one or more sides which are relatively short, and the shielding case 5 may be held with the gripping members 3 arranged for the remaining sides.

The number of gripping members 3 to be arranged corresponding to each side is also optionally determined. For example, a greater number of gripping members 3 may be disposed than the case illustrated in FIG. 1. Alternatively, a smaller number of gripping members 3 may be disposed than the case illustrated in FIG. 1. Moreover, in the case illustrated in FIG. 1, all of the plurality of gripping members 3 have the same shape. However, there may be gripping members different in dimensions and shape.

In the above described embodiment, the four grip portions 15, 16, 15, 16 are provided in one gripping member 3, and these four grip portions 15, 16, 15, 16 form two pairs. However, how many grip portions to be provided and how many pairs to be formed are optionally determined. For example, the grip member may have the two grip portions 15, 16 that make one pair. Alternatively, the gripping member may have six or more grip portions 15, 16, . . . , 15, 16 that make three or more pairs.

What is claimed is:

1. An electromagnetic shielding structure comprising:
one or more gripping members and a shielding case,
the one or more gripping members being surface-mounted on a mounting surface of an electronic component of a printed circuit board,
the shielding case being held with the gripping member and thereby attached to the printed circuit board,
the shielding case comprising a roof section and a plurality of side walls,
the roof section configured to face the printed circuit board at a position to form a gap with the printed circuit board when the shielding case is attached to the printed circuit board, each of the plurality of side walls configured to be held with the gripping member in a state hanging toward the printed circuit board from each of a plurality of positions on a periphery of the roof section when the shielding case is attached to the printed circuit board, the roof section comprising a polygonal panel that is shaped so as not to fit inside a 30 mm ×30 mm square region,
the side walls comprising panels that are provided so as to hang from portions corresponding to part or entirety of some of sides of the polygonal roof, each side wall being configured to contact the gripping member at a position within a predetermined distance from an edge of that side wall in a direction perpendicular to both a thickness direction of that side wall and a thickness direction of the printed circuit board,
the electronic component mounted on the mounting surface being configured to be accommodated in a space surrounded by the printed circuit board, the roof section, and the side walls, and a conductor provided on the printed circuit board and the shielding case being configured to be electrically connected via the gripping member, when the shielding case is attached to the printed circuit board;
the inner surface side grip portion and the outer surface side grip portion respectively have a spring portion formed by cutting and raising part of the inner surface side grip portion and the outer surface side grip portion into a tongue shape, a spring length from a base end to a leading end of the spring portion of one of the inner surface side grip portion and the outer surface side grip portion is greater than a spring length from a base end to a leading end of the spring portion of the other of the inner surface side grip portion and the outer surface side grip portion, one of the spring portion of the inner surface side grip portion and the spring portion of the outer surface side grip portion has a convex portion that projects toward the other of the spring portion of the inner surface side grip portion and the spring portion of the outer surface side grip portion;

wherein each of the one or more gripping members comprises one or more grip portions, the grip portions comprising one or more inner surface side grip portions to be pressed against an inner surface of an end region of the side wall and one or more outer surface side grip portions to be pressed against an outer surface of the end region of the side wall, and the inner surface side grip portion and the outer surface side grip portion provided on the one or more gipping members are configured to hold the shielding case, and wherein the end region of the side wall is provided with a hole and the spring portion of one of the inner surface side grip portion and the outer surface side grip portion having the spring length that is shorter is configured to be fitted into the hole such that it is difficult for the side wall to escape from between the inner surface side grip portion and the outer surface side grip portion.

2. The electromagnetic shielding structure according to claim 1, wherein the end region of the side wall is configured to contact the gripping member at a position spaced by 2 to 5 mm from the edge of the side wall in the direction perpendicular to both the thickness direction of the side wall and the thickness direction of the printed circuit board.

3. The electromagnetic shielding structure according to claim 1, wherein, if the single side wall is held with a plurality of the gripping members, each of the adjacent gripping members and the end region of the side wall are configured to contact at a position spaced by 2 to 5 mm from each other.

4. The electromagnetic shielding structure according to claim 1, wherein the gripping member is formed to have a dimension of 2 to 10 mm in the direction perpendicular to both the thickness direction of the side wall and the thickness direction of the printed circuit board.

5. The electromagnetic shielding structure according to claim 1, wherein each of the one or more gripping members comprises one or more grip portions, the grip portion comprising one or more inner surface side grip portions to be pressed against an inner surface of the end region of the side wall and one or more outer surface side grip portions to be pressed against an outer surface of the end region of the side wall, and the inner surface side grip portion and the outer surface side grip portion provided on the one or more gripping members are configured to cooperate to hold the shielding case, the inner surface side grip portion and the outer surface side grip portion are formed to have a dimension of 1 to 2 mm in the direction perpendicular to both the thickness direction of the side wall and the thickness direction of the printed circuit board.

6. The electromagnetic shielding structure according to claim 1, wherein the gripping member has a suction surface that can be suctioned by a suction nozzle of an automatic mounting machine, and the suction surface is formed to have a dimension of 0.5 to 2 mm in the direction perpendicular to both the thickness direction of the side wall and the thickness direction of the printed circuit board.

7. The electromagnetic shielding structure according to claim 2, wherein, if the single side wall is held with a plurality of the gripping members, each of the adjacent gripping members and the side wall are configured to contact at a position spaced by 2 to 5 mm from each other.

8. The electromagnetic shielding structure according to claim 7, wherein the gripping member is formed to have a dimension of 2 to 10 mm in the direction perpendicular to both the thickness direction of the side wall and the thickness direction of the printed circuit board.

9. The electromagnetic shielding structure according to claim 8, wherein each of the one or more gripping members comprises one or more grip portions, the grip portion comprising one or more inner surface side grip portions to be pressed against an inner surface of the end region of the side wall and one or more outer surface side grip portions to be pressed against an outer surface of the end region of the side wall, and the inner surface side grip portion and the outer surface side grip portion provided on the one or more gripping members are configured to cooperate to hold the shielding case, the inner surface side grip portion and the outer surface side grip portion are formed to have a dimension of 1 to 2 mm in the direction perpendicular to both the thickness direction of the side wall and the thickness direction of the printed circuit board.

10. The electromagnetic shielding structure according to claim 9, wherein the gripping member has a suction surface that can be suctioned by a suction nozzle of an automatic mounting machine, and the suction surface is formed to have a dimension of 0.5 to 2 mm in the direction perpendicular to both the thickness direction of the side wall and the thickness direction of the printed circuit board.

11. An electromagnetic shielding structure comprising:
one or more gripping members and a shielding case,
the one or more gripping members being surface-mounted on a mounting surface of an electronic component of a printed circuit board,
the shielding case being held with the gripping member and thereby attached to the printed circuit board,
the shielding case comprising a roof section and a plurality of side walls,
the roof section configured to face the printed circuit board at a position to form a gap with the printed circuit board when the shielding case is attached to the printed circuit board, each of the plurality of side walls configured to be held with the gripping member in a state hanging toward the printed circuit board from each of a plurality of positions on a periphery of the roof section when the shielding case is attached to the printed circuit board, the roof section comprising a polygonal panel that is shaped so as not to fit inside a 30 mm ×30 mm square region,
the side walls comprising panels that are provided so as to hang from portions corresponding to part or entirety of some of sides of the polygonal roof, each side wall being configured to contact the gripping member at a position within a predetermined distance from an edge of that side wall in a direction perpendicular to both a thickness direction of that side wall and a thickness direction of the printed circuit board,
the electronic component mounted on the mounting surface being configured to be accommodated in a space surrounded by the printed circuit board, the roof section, and the side walls, and a conductor provided on the printed circuit board and the shielding case being configured to be electrically connected via the gripping member, when the shielding case is attached to the printed circuit board;

the inner surface side grip portion and the outer surface side grip portion respectively have a spring portion formed by cutting and raising part of the inner surface side grip portion and the outer surface side grip portion into a tongue shape, a spring length from a base end to a leading end of the spring portion of one of the inner surface side grip portion and the outer surface side grip portion is greater than a spring length from a base end to a leading end of the spring portion of the other of the inner surface side grip portion and the outer surface side grip portion, one of the spring portion of the inner surface side grip portion and the spring portion of the outer surface side grip portion has a convex portion that projects toward the other of the spring portion of the inner surface side grip portion and the spring portion of the outer surface side grip portion;

wherein each of the one or more gripping members comprises one or more grip portions, the grip portions comprising one or more inner surface side grip portions to be pressed against an inner surface of an end region of the side wall and one or more outer surface side grip portions to be pressed against an outer surface of the end region of the side wall, and the inner surface side grip portion and the outer surface side grip portion provided on the one or more gipping members are configured to hold the shielding case, and wherein the end region of the side wall does not include a hole and the spring portion of the inner surface side grip portion and the spring portion of the outer surface side grip portion press against the side wall to generate an undulating distortion in the end region of the side wall such that it is difficult for the side wall to escape from between the inner surface side grip portion and the outer surface side grip portion.

12. The electromagnetic shielding structure according to claim 11, wherein the end region of the side wall is configured to contact the gripping member at a position spaced by 2 to 5 mm from the edge of the side wall in the direction perpendicular to both the thickness direction of the side wall and the thickness direction of the printed circuit board.

13. The electromagnetic shielding structure according to claim 11, wherein, the single side wall is held with a plurality of the gripping members and each of the adjacent gripping members and the end region of the side wall are configured to contact at a position spaced by 2 to 5 mm from each other.

14. The electromagnetic shielding structure according to claim 11, wherein the gripping member is formed to have a dimension of 2 to 10 mm in the direction perpendicular to both the thickness direction of the side wall and the thickness direction of the printed circuit board.

15. The electromagnetic shielding structure according to claim 11, wherein each of the one or more gripping members comprises one or more grip portions, the grip portion comprising one or more inner surface side grip portions to be pressed against an inner surface of the end region of the side wall and one or more outer surface side grip portions to be pressed against an outer surface of the end region of the side wall, and the inner surface side grip portion and the outer surface side grip portion provided on the one or more gripping members are configured to cooperate to hold the shielding case, the inner surface side grip portion and the outer surface side grip portion are formed to have a dimension of 1 to 2 mm in the direction perpendicular to both the thickness direction of the side wall and the thickness direction of the printed circuit board.

16. The electromagnetic shielding structure according to claim 11, wherein the gripping member has a suction surface that can be suctioned by a suction nozzle of an automatic mounting machine, and the suction surface is formed to have a dimension of 0.5 to 2 mm in the direction perpendicular to both the thickness direction of the side wall and the thickness direction of the printed circuit board.

17. The electromagnetic shielding structure according to claim 12, wherein, if the single side wall is held with a plurality of the gripping members, each of the adjacent gripping members and the side wall are configured to contact at a position spaced by 2 to 5 mm from each other.

18. The electromagnetic shielding structure according to claim 17, wherein the gripping member is formed to have a dimension of 2 to 10 mm in the direction perpendicular to both the thickness direction of the side wall and the thickness direction of the printed circuit board.

19. The electromagnetic shielding structure according to claim 18, wherein each of the one or more gripping members comprises one or more grip portions, the grip portion comprising one or more inner surface side grip portions to be pressed against an inner surface of the end region of the side wall and one or more outer surface side grip portions to be pressed against an outer surface of the end region of the side wall, and the inner surface side grip portion and the outer surface side grip portion provided on the one or more gripping members are configured to cooperate to hold the shielding case, the inner surface side grip portion and the outer surface side grip portion are formed to have a dimension of 1 to 2 mm in the direction perpendicular to both the thickness direction of the side wall and the thickness direction of the printed circuit board.

20. The electromagnetic shielding structure according to claim 19, wherein the gripping member has a suction surface that can be suctioned by a suction nozzle of an automatic mounting machine, and the suction surface is formed to have a dimension of 0.5 to 2 mm in the direction perpendicular to both the thickness direction of the side wall and the thickness direction of the printed circuit board.

\* \* \* \* \*